United States Patent
Sutardja et al.

(10) Patent No.: US 8,392,799 B1
(45) Date of Patent: Mar. 5, 2013

(54) SYSTEMS AND METHODS FOR ARBITRATING USE OF PROCESSOR MEMORY

(75) Inventors: Pantas Sutardja, Los Gatos, CA (US); Hong-Yi Chen, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/465,964

(22) Filed: May 7, 2012

Related U.S. Application Data

(62) Division of application No. 11/789,605, filed on Apr. 25, 2007, now Pat. No. 8,176,386.

(60) Provisional application No. 60/910,959, filed on Apr. 10, 2007.

(51) Int. Cl.
*G11C 29/00* (2006.01)

(52) U.S. Cl. .................................................. 714/763

(58) Field of Classification Search .................. 714/763
See application file for complete search history.

(56) References Cited

U.S. PATENT DOCUMENTS

| | | | |
|---|---|---|---|
| 4,322,802 A * | 3/1982 | Lewis et al. .................. 700/125 |
| 4,396,983 A | 8/1983 | Segarra et al. |
| 5,412,666 A | 5/1995 | Squires et al. |
| 5,754,764 A | 5/1998 | Davis et al. |
| 6,043,946 A | 3/2000 | Genheimer et al. |
| 6,430,652 B1 | 8/2002 | Fechser et al. |
| 7,334,121 B2 | 2/2008 | Lee |
| 2007/0053094 A1 | 3/2007 | Kitamura et al. |
| 2007/0101094 A1 | 5/2007 | Thayer et al. |
| 2007/0279781 A1 | 12/2007 | Tomita |
| 2010/0034208 A1* | 2/2010 | Ayrapetian et al. .......... 370/401 |

* cited by examiner

*Primary Examiner* — Guy Lamarre

(57) ABSTRACT

A system including a processor, a first-in first-out (FIFO) module, and an arbiter module. The processor includes i) a processor core and ii) a memory. The FIFO module is configured to receive streaming data, output the streaming data to the memory of the processor, and selectively generate a control signal. The arbiter module is configured to adjust, based on the control signal, a priority in which at least one of the processor core and the FIFO module accesses the memory of the processor.

25 Claims, 8 Drawing Sheets

SYSTEMS AND METHODS FOR ARBITRATING USE OF PROCESSOR MEMORY

CROSS-REFERENCE TO RELATED APPLICATIONS

This application is a Divisional of U.S. application Ser. No. 11/789,605, filed Apr. 25, 2007, which claims the benefit of U.S. Provisional Application No. 60/910,959, filed Apr. 10, 2007. The disclosures of the above applications are incorporated herein by reference in their entirety.

FIELD

The present disclosure relates to electronic data processing systems, and more particularly to processing streaming data.

BACKGROUND

The background description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present disclosure.

Electronic data processing often involves receiving, storing, and processing streaming data. Examples of devices that may receive, store, and process streaming data include receivers, signal processors, electronic testers, storage devices such as disk drives, etc. Streaming data is generally received in large quantities and at high data rates. Thus, to store streaming data, the devices receiving the data may need large amounts of high-capacity, high-speed memory in addition to the memory that the devices use for normal operations.

As an example, a hard disk drive (HDD) is described in detail. Referring now to FIG. 1, HDD 10 includes a hard disk assembly (HDA) 12 and a HDD printed circuit board (PCB) 14. The HDA 12 may include one or more circular magnetic surfaces called platters 16. The platters 16 are arranged in a stack, and the stack is rotated by a spindle motor 18. One or more read/write devices called heads 20 may read and write data on the platters 16.

Each head 20 may include a write element such as an inductor that generates a magnetic field and a read element such as a magneto-resistive (MR) element that senses the magnetic field on the platter 16. The head 20 is mounted at a distal end of an actuator arm 22. An actuator such as a voice coil motor (VCM) 24 or a stepper motor (not shown) moves the actuator arm 22 relative to the platters 16 during read/write operations.

The HDA 12 includes a preamplifier module 26 that amplifies signals generated by and input to the heads 20. When reading data, the preamplifier module 26 amplifies low-level analog signals received from the read element and outputs amplified analog signals to a read-channel module 28. When writing data, the preamplifier module 26 generates write current that flows through the write element of the head 20. The write current is switched to produce a magnetic field having a positive or a negative polarity. The positive or negative polarity is stored on the platters 16 and is used to represent binary data.

The HDD PCB 14 includes the read-channel module 28, a hard disk controller (HDC) module 30, a processor 32, a spindle/VCM driver module 34, a buffer 36, and an input/output (I/O) interface 38. During write operations, the read-channel module 28 may encode the data to be written using error correction coding (ECC), run length limited coding (RLL), etc., and transmit the encoded data to the preamplifier module 26.

During read operations, the read-channel module 28 receives analog signals from the preamplifier module 26. The read-channel module 28 converts the analog signals into a digital format and outputs digital signals. The read-channel module 28 may filter the digital signals. The read-channel module 28 decodes the digital signals to generate the data read from the platters 16. Additionally, the read-channel module 28 detects and corrects errors in the data read from the platters 16.

The HDC module 30 controls various operations of the HDD 10. For example, the HDC module 30 generates commands that control the speed of the spindle motor 18 and the movement of the actuator arm 22. The spindle/VCM driver module 34 implements the commands and generates control signals that control the speed of the spindle motor 18 and the positioning of the actuator arm 22 during read/write operations.

The HDC module 30 may communicate with an external device (not shown) such as a host adapter via the I/O interface 38. The HDC module 30 may receive data to be written on the platters 16 and commands to read data from the platters 16 from the external device. Accordingly, the HDC module 30 may transmit data to be written on the platters 16 to the read-channel module 28 and data read by the heads 20 to the external device. The HDC module 30 may use the buffer 36 to store data and commands. The buffer 36 may employ volatile memory having low latency such as SDRAM. Additionally, nonvolatile memory such as flash memory may be utilized to store control code executed by the processor 32.

The processor 32 processes data, including encoding, decoding, formatting, etc. Additionally, the processor 32 processes servo or positioning information to position the heads 20 at correct locations on the platters 16 during read/write operations. Servo, which is stored on the platters 16, ensures that data is written to and read from correct locations on the platters 16. In some implementations, a self-servo write (SSW) module 40 may write servo on the platters 16 using the heads 20 before the HDD 10 can be used to store data.

Portions of the HDD 10 may be implemented by one or more modules. For example, the HDC module 30 and the processor 32 may be implemented by a single module. Additionally, the read-channel module 28 and/or the spindle/VCM driver module 34 may be implemented by the single module and/or by additional modules, etc. Alternatively, most of the HDD 10 except the HDA 12 may be implemented by a single integrated circuit (IC) called a system-on-chip (SOC). For example, the SOC may implement all the components of the HDD PCB 14.

Occasionally, data stored on the HDD 10 may get corrupted and may be unreadable due to various reasons. For example, noise, physical defects on the surface of platters 16, defects in one or more modules, etc. may corrupt the data. Original data may be recovered using the hardware built into the read-channel module 28. However, the error-correcting capability of the hardware may be limited. Consequently, the read-channel module 28 may be unable to correct all the errors in the data.

SUMMARY

A disk drive system-on-chip (SOC) comprises a read-channel module and a processor. The read-channel module reads data, includes a first error-correcting module for correcting errors in the data, corrects errors in a first portion of the data using the first error-correcting module, and is unable to correct errors in a second portion of the data using the first error-correcting module. The processor includes a processor core and processor memory, receives the second portion of the data in the processor memory, and corrects errors in the second portion of the data using a second error-correcting module that is different than the first error-correcting module.

In another feature, the disk drive SOC further comprises a first-in first-out (FIFO) module that receives the second portion of the data from the read-channel module and that outputs the second portion of the data to the processor memory via direct memory access (DMA) to the processor memory.

In another feature, the disk drive SOC further comprises an arbiter module that communicates with the processor core and the FIFO module, that adjusts priority of at least one of the processor core and the FIFO module to access the processor memory based on memory available in the FIFO module, and that generates a control signal.

In another feature, the disk drive SOC further comprises a multiplexer that communicates with the processor core, the processor memory, the FIFO module, and the arbiter module and that grants one of the processor core and the FIFO module access to the processor memory based on the control signal.

In still other features, a system comprises a processor, a first-in first-out (FIFO) module, and an arbiter module. The processor includes a processor core and processor memory. The FIFO module receives streaming data, outputs the streaming data to the processor memory, and selectively generates a control signal. The arbiter module adjusts priority of at least one of the processor core and the FIFO module to access the processor memory based on the control signal.

In another feature, the FIFO module outputs the streaming data to the processor memory via direct memory access (DMA) to the processor memory.

In another feature, the FIFO module generates the control signal when memory available in the FIFO module to store the streaming data decreases to less than a first predetermined threshold.

In another feature, the arbiter module increases the priority of the FIFO module to access the processor memory when the memory available in the FIFO module to store the streaming data decreases to less than the first predetermined threshold.

In another feature, the FIFO module outputs the streaming data to the processor memory at an increased priority determined by the arbiter module until the memory available in the FIFO module increases to greater than a second predetermined threshold.

In another feature, the arbiter module decreases the priority of the processor core to access the processor memory when the memory available in the FIFO module decreases to less than the first predetermined threshold.

In another feature, the processor core accesses the processor memory at a decreased priority determined by the arbiter module until the memory available in the FIFO module increases to greater than a second predetermined threshold.

In another feature, the FIFO module generates the control signal when memory available in the FIFO module increases to greater than a first predetermined threshold.

In another feature, the arbiter module decreases the priority of the FIFO module to access the processor memory when the memory available in the FIFO module increases to greater than the first predetermined threshold.

In another feature, the FIFO module outputs the streaming data to the processor memory at a decreased priority determined by the arbiter module until the memory available in the FIFO module decreases to less than a second predetermined threshold.

In another feature, the arbiter module increases the priority of the processor core to access the processor memory when the memory available in the FIFO module increases to greater than the first predetermined threshold.

In another feature, the processor core accesses the processor memory at an increased priority determined by the arbiter module until the memory available in the FIFO module decreases to less than a second predetermined threshold.

In another feature, a disk drive system-on-chip (SOC) comprises the system and further comprises a read-channel module that outputs the streaming data to the FIFO module.

In another feature, a network device comprises the system.

In another feature, a signal processing device comprises the system.

In still other features, a disk drive system-on-chip (SOC) comprises a read-channel module, a processor, a first-in first-out (FIFO) module, an arbiter module, and a multiplexer. The read-channel module reads data, includes a first error-correcting module for correcting errors in the data, corrects errors in a first portion of the data using the first error-correcting module, and is unable to correct errors in a second portion of the data using the first error-correcting module. The processor communicates with the read-channel module and includes a processor core and processor memory.

The FIFO module receives the second portion of the data, outputs the second portion of the data to the processor memory via direct memory access (DMA) to the processor memory, and generates a first control signal based on memory available in the FIFO module, wherein the processor core corrects errors in the second portion of the data using a second error-correcting module that is different than the first error-correcting module.

The arbiter module adjusts priority of at least one of the processor core and the FIFO module to access the processor memory based on the first control signal and that generates a second control signal. The multiplexer communicates with the processor core, the processor memory, the FIFO module, and the arbiter module and grants one of the processor core and the FIFO module access to the processor memory based on the second control signal.

In another feature, the arbiter module increases the priority of the FIFO module relative to the processor core to access the processor memory when the memory available in the FIFO module is less than a first predetermined threshold and restores the priority of the FIFO module when the memory available in the FIFO module is greater than a second predetermined threshold.

In another feature, the read-channel module processes the data comprising analog signals and generates at least one of digital and filtered data, and wherein the second portion of the data includes portions of the at least one of digital and filtered data, where the portions include errors not corrected by the first error-correcting module.

In still other features, a method comprises reading data, correcting errors in a first portion of the data using a first error-correcting module, receiving a second portion of the data in processor memory included in a processor, wherein the first error-correcting module is unable to correct errors in the second portion of the data, and correcting errors in the second portion of the data using a second error-correcting module that is different than the first error-correcting module.

In another feature, the method further comprises accessing the processor memory via direct memory access (DMA) to the processor memory and receiving the second portion of the data in the processor memory from a first-in first-out (FIFO) module via the DMA to the processor memory.

In another feature, the method further comprises adjusting priority of at least one of a processor core included in the processor and the FIFO module to access the processor memory based on memory available in the FIFO module and generating a control signal.

In another feature, the method further comprises communicating with the processor core, the processor memory, the FIFO module, and the arbiter module and granting one of the processor core and the FIFO module access to the processor memory based on the control signal.

In still other features, a method comprises receiving streaming data in a first-in first-out (FIFO) module, outputting the streaming data from the FIFO module to processor memory included in a processor, selectively generating a control signal, and adjusting priority of at least one of a processor core included in the processor and the FIFO module to access the processor memory based on the control signal.

In another feature, the method further comprises accessing the processor memory via direct memory access (DMA) to the processor memory and outputting the streaming data to the processor memory via the DMA to the processor memory.

In another feature, the method further comprises generating the control signal when memory available in the FIFO module to store the streaming data decreases to less than a first predetermined threshold.

In another feature, the method further comprises increasing the priority of the FIFO module to access the processor memory when the memory available in the FIFO module to store the streaming data decreases to less than the first predetermined threshold.

In another feature, the method further comprises outputting the streaming data to the processor memory at an increased priority until the memory available in the FIFO module increases to greater than a second predetermined threshold.

In another feature, the method further comprises decreasing the priority of the processor core to access the processor memory when the memory available in the FIFO module decreases to less than the first predetermined threshold.

In another feature, the method further comprises the processor core accessing the processor memory at a decreased priority until the memory available in the FIFO module increases to greater than a second predetermined threshold.

In another feature, the method further comprises generating the control signal when memory available in the FIFO module increases to greater than a first predetermined threshold.

In another feature, the method further comprises decreasing the priority of the FIFO module to access the processor memory when the memory available in the FIFO module increases to greater than the first predetermined threshold.

In another feature, the method further comprises outputting the streaming data to the processor memory at a decreased priority until the memory available in the FIFO module decreases to less than a second predetermined threshold.

In another feature, the method further comprises increasing the priority of the processor core to access the processor memory when the memory available in the FIFO module increases to greater than the first predetermined threshold.

In another feature, the method further comprises the processor core accessing the processor memory at an increased priority until the memory available in the FIFO module decreases to less than a second predetermined threshold.

In still other features, a method comprises reading data and correcting errors in a first portion of the data using a first error-correcting module. The method further comprises receiving a second portion of the data in processor memory included in a processor from a first-in first-out (FIFO) module via direct memory access (DMA) to the processor memory, wherein the first error-correcting module is unable to correct errors in the second portion of the data.

In another feature, the method further comprises generating a first control signal based on memory available in the FIFO module and correcting errors in the second portion of the data using a second error-correcting module that is different than the first error-correcting module. The method further comprises adjusting priority of at least one of a processor core included in the processor and the FIFO module to access the processor memory based on the first control signal. The method further comprises generating a second control signal and granting access of one of the processor core and the FIFO module access to the processor memory based on the second control signal.

In another feature, the method further comprises increasing the priority of the FIFO module relative to the processor core to access the processor memory when the memory available in the FIFO module is less than a predetermined threshold and restoring the priority of the FIFO module when the memory available in the FIFO module is greater than the predetermined threshold.

In another feature, the method further comprises processing the data comprising analog signals, generating at least one of digital and filtered data, and including portions of the at least one of digital and filtered data in the second portion of the data, where the portions include errors not corrected by the first error-correcting module.

In still other features, a disk drive system-on-chip (SOC) comprises read-channel means for reading data, wherein the read-channel means includes first error-correcting means for correcting errors, and correcting errors in a first portion of the data using the first error-correcting means, wherein the read-channel means is unable to correct errors in a second portion of the data using the first error-correcting means. The disk drive SOC further comprise processor means for processing that includes processor core means for processing and processor memory means for storing portions of the data, receiving the second portion of the data in the processor memory means, and correcting errors in the second portion of the data using second error-correcting means for correcting errors that is different than the first error-correcting means.

In another feature, the disk drive SOC further comprises first-in first-out (FIFO) means for receiving the second portion of the data from the read-channel means and outputting the second portion of the data to the processor memory means via direct memory access (DMA) to the processor memory means.

In another feature, the disk drive SOC further comprises arbiter means for communicating with the processor core means and the FIFO means, adjusting priority of at least one of the processor core means and the FIFO means to access the processor memory means based on memory available in the FIFO means, and generating a control signal.

In another feature, the disk drive SOC further comprises multiplexer means for communicating with the processor core means, the processor memory means, the FIFO means, and the arbiter means and granting one of the processor core means and the FIFO means access to the processor memory means based on the control signal.

In still other features, a system comprises processor means for processing data that includes processor core means for processing the data and processor memory means for storing the data. The system further comprises first-in first-out (FIFO) means for receiving streaming data, outputting the streaming data to the processor memory means, and selectively generating a control signal. The system further comprises arbiter means for adjusting priority of at least one of the processor core means and the FIFO means to access the processor memory means based on the control signal.

In another feature, the FIFO means outputs the streaming data to the processor memory means via direct memory access (DMA) to the processor memory means.

In another feature, the FIFO means generates the control signal when memory available in the FIFO means to store the streaming data decreases to less than a first predetermined threshold.

In another feature, the arbiter means increases the priority of the FIFO means to access the processor memory means when the memory available in the FIFO means to store the streaming data decreases to less than the first predetermined threshold.

In another feature, the FIFO means outputs the streaming data to the processor memory means at an increased priority determined by the arbiter means until the memory available in the FIFO means increases to greater than a second predetermined threshold.

In another feature, the arbiter means decreases the priority of the processor core means to access the processor memory means when the memory available in the FIFO means decreases to less than the first predetermined threshold.

In another feature, the processor core means accesses the processor memory means at a decreased priority determined by the arbiter means until the memory available in the FIFO means increases to greater than a second predetermined threshold.

In another feature, the FIFO means generates the control signal when memory available in the FIFO means increases to greater than a first predetermined threshold.

In another feature, the arbiter means decreases the priority of the FIFO means to access the processor memory means when the memory available in the FIFO means increases to greater than the first predetermined threshold.

In another feature, the FIFO means outputs the streaming data to the processor memory means at a decreased priority determined by the arbiter means until the memory available in the FIFO means decreases to less than a second predetermined threshold.

In another feature, the arbiter means increases the priority of the processor core means to access the processor memory means when the memory available in the FIFO means increases to greater than the first predetermined threshold.

In another feature, the processor core means accesses the processor memory means at an increased priority determined by the arbiter means until the memory available in the FIFO means decreases to less than a second predetermined threshold.

In another feature, a disk drive system-on-chip (SOC) comprises the system and further comprises read-channel means for outputting the streaming data to the FIFO means.

In another feature, a network device comprises the system.

In another feature, a signal processing device comprises the system.

In still other features, a disk drive system-on-chip (SOC) comprises read-channel means for reading data, wherein the read-channel means includes first error-correcting means for correcting errors, and correcting errors in a first portion of the data using the first error-correcting means, wherein the read-channel means is unable to correct errors in a second portion of the data using the first error-correcting means. The disk drive SOC further comprises processor means for communicating with the read-channel means, wherein the processor means includes processor core means for processing and processor memory means for storing portions of the data.

In another feature, the disk drive SOC further comprises first-in first-out (FIFO) means for receiving the second portion of the data, outputting the second portion of the data to the processor memory means via direct memory access (DMA) to the processor memory means, and generating a first control signal based on memory available in the FIFO means, wherein the processor core means corrects errors in the second portion of the data using second error-correcting means for correcting errors that is different than the first error-correcting means.

In another feature, the disk drive SOC further comprises arbiter means for adjusting priority of at least one of the processor core means and the FIFO means to access the processor memory means based on the first control signal and generating a second control signal. The disk drive SOC further comprises multiplexer means for communicating with the processor core means, the processor memory means, the FIFO means, and the arbiter means and granting one of the processor core means and the FIFO means access to the processor memory means based on the second control signal.

In another feature, the arbiter means increases the priority of the FIFO means relative to the processor core means to access the processor memory means when the memory available in the FIFO means is less than a predetermined threshold and restores the priority of the FIFO means when the memory available in the FIFO means is greater than the predetermined threshold.

In another feature, the read-channel means processes the data comprising analog signals and generates at least one of digital and filtered data, and wherein the second portion of the data includes portions of the at least one of digital and filtered data, where the portions include errors not corrected by the first error-correcting means.

In still other features, a computer program executed by a processor comprises reading data, correcting errors in a first portion of the data using a first error-correcting module, receiving a second portion of the data in processor memory included in the processor, wherein the first error-correcting module is unable to correct errors in the second portion of the data, and correcting errors in the second portion of the data using a second error-correcting module that is different than the first error-correcting module.

In another feature, the computer program further comprises accessing the processor memory via direct memory access (DMA) to the processor memory and receiving the second portion of the data in the processor memory from a first-in first-out (FIFO) module via the DMA to the processor memory.

In another feature, the computer program further comprises adjusting priority of at least one of a processor core included in the processor and the FIFO module to access the processor memory based on memory available in the FIFO module and generating a control signal.

In another feature, the computer program further comprises communicating with the processor core, the processor memory, the FIFO module, and the arbiter module and granting one of the processor core and the FIFO module access to the processor memory based on the control signal.

In still other features, a computer program executed by a processor comprises receiving streaming data in a first-in first-out (FIFO) module, outputting the streaming data from the FIFO module to processor memory included in the processor, selectively generating a control signal, and adjusting priority of at least one of a processor core included in the processor and the FIFO module to access the processor memory based on the control signal.

In another feature, the computer program further comprises accessing the processor memory via direct memory access (DMA) to the processor memory and outputting the streaming data to the processor memory via the DMA to the processor memory.

In another feature, the computer program further comprises generating the control signal when memory available in the FIFO module to store the streaming data decreases to less than a first predetermined threshold.

In another feature, the computer program further comprises increasing the priority of the FIFO module to access the processor memory when the memory available in the FIFO module to store the streaming data decreases to less than the first predetermined threshold.

In another feature, the computer program further comprises outputting the streaming data to the processor memory at an increased priority until the memory available in the FIFO module increases to greater than a second predetermined threshold.

In another feature, the computer program further comprises decreasing the priority of the processor core to access the processor memory when the memory available in the FIFO module decreases to less than the first predetermined threshold.

In another feature, the computer program further comprises the processor core accessing the processor memory at a decreased priority until the memory available in the FIFO module increases to greater than a second predetermined threshold.

In another feature, the computer program further comprises generating the control signal when memory available in the FIFO module increases to greater than a first predetermined threshold.

In another feature, the computer program further comprises decreasing the priority of the FIFO module to access the processor memory when the memory available in the FIFO module increases to greater than the first predetermined threshold.

In another feature, the computer program further comprises outputting the streaming data to the processor memory at a decreased priority until the memory available in the FIFO module decreases to less than a second predetermined threshold.

In another feature, the computer program further comprises increasing the priority of the processor core to access the processor memory when the memory available in the FIFO module increases to greater than the first predetermined threshold.

In another feature, the computer program further comprises the processor core accessing the processor memory at an increased priority until the memory available in the FIFO module decreases to less than a second predetermined threshold.

In still other features, a computer program executed by a processor comprises reading data and correcting errors in a first portion of the data using a first error-correcting module. The computer program further comprises receiving a second portion of the data in processor memory included in the processor from a first-in first-out (FIFO) module via direct memory access (DMA) to the processor memory, wherein the first error-correcting module is unable to correct errors in the second portion of the data.

The computer program further comprises generating a first control signal based on memory available in the FIFO module and correcting errors in the second portion of the data using a second error-correcting module that is different than the first error-correcting module. The computer program further comprises adjusting priority of at least one of a processor core included in the processor and the FIFO module to access the processor memory based on the first control signal. The computer program further comprises generating a second control signal and granting access of one of the processor core and the FIFO module access to the processor memory based on the second control signal.

In another feature, the computer program further comprises increasing the priority of the FIFO module relative to the processor core to access the processor memory when the memory available in the FIFO module is less than a predetermined threshold and restoring the priority of the FIFO module when the memory available in the FIFO module is greater than the predetermined threshold.

In another feature, the computer program further comprises processing the data comprising analog signals, generating at least one of digital and filtered data, and including portions of the at least one of digital and filtered data in the second portion of the data, where the portions include errors not corrected by the first error-correcting module.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
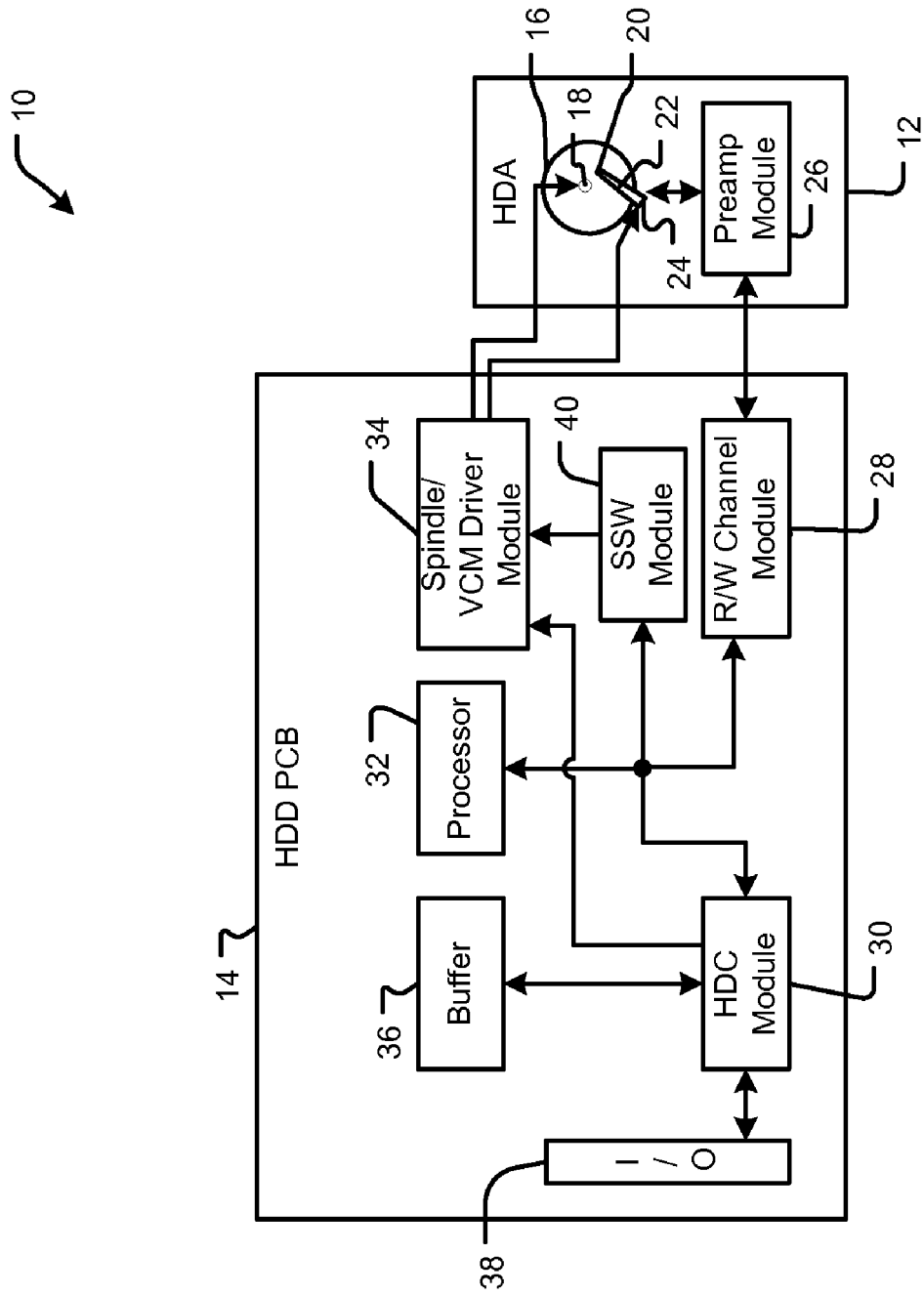
FIG. 1 is a functional block diagram of a hard disk drive (HDD)

The following description is merely exemplary in nature and is in no way intended to limit the disclosure, its application, or uses. For purposes of clarity, the same reference numbers will be used in the drawings to identify similar elements. As used herein, the term module, circuit, and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Raw data that cannot be corrected by hardware may be streamed to a processor. The processor may recover original data from the raw data using data-recovery algorithms implemented by firmware and/or software. These algorithms, however, may be complex. Consequently, recovering original data using these algorithms may be slower but more powerful than the data recovery using hardware.

The raw data is generally streaming data having high data rates. For example, the streaming data received from a read-channel module of a disk drive in data-recovery mode may have data rates of the order of several giga-samples per second, where 1 giga-sample=$10^9$ samples. Consequently, streaming data may be lost if the data is not processed at a rate faster than the rate at which the data is received. Alternatively, the data may be lost if the data is not temporarily stored for later processing.

Figure 2B:
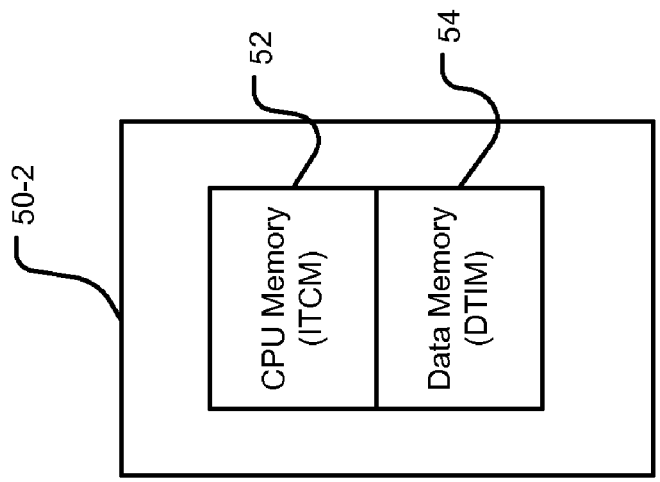
FIG. 2B is a functional block diagram of processor memory.
Figure 2A:
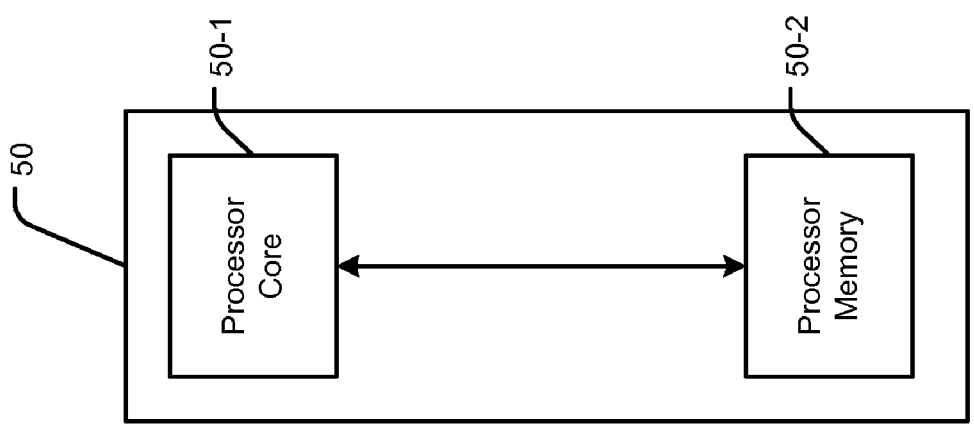
FIG. 2A is a functional block diagram of a processor.

System-on-chip (SOC) architecture, wherein one or more components of a system are implemented by a single integrated circuit (IC), is being increasingly used in disk drives, network devices, handheld electronic devices, etc. A system-on-chip may comprise at least one processor. Referring now to FIGS. 2A-2B, a processor 50 may comprise a processor core 50-1 and processor memory 50-2. The processor memory 50-2 may include two types of memory: instruction tightly coupled memory (ITCM) 52 and data tightly coupled memory (DTCM) 54.

In tightly coupled memory architecture, a plurality of processors may be coupled to a memory module either directly or via a shared memory bus. The memory bus may be designed to reduce or minimize resistive-capacitive (RC) components such as bus length (corresponding to resistance) and/or parasitic capacitance between adjacent conducting lines in the bus. Consequently, bandwidth and memory access efficiency may be increased.

The processor core 50-1 may use the ITCM 52 to store instructions or commands that the processor core 50-1 executes. Additionally, operands and results of operations performed by the processor core 50-1 on the operands may be stored in the ITCM 52. Data to be processed by the processor core 50-1 may be stored in the DTCM 54. For convenience, the ITCM 52 may be called CPU memory 52, and the DTCM 54 may be called data memory 54.

Theoretically, the processor 50 may be able to process the streaming data as fast as the data is received. For example, the processor memory 50-2 may be 64-bit (i.e., 8-byte) wide, and the processor clock may be of the order of 200 MHz. That is, the processor 50 may be able to process $8*200*10^6$=1.6 giga-samples per second. Thus, the processor 50 may be able to recover original data from the streaming data received from a read-channel module of a disk drive using the processor memory 50-2.

The processor 50, however, may perform other functions in addition to processing the streaming data. For example, the processor 50 may perform servo calculations. The processor 50 may need portions of processor memory 50-2 to perform these functions. Thus, the streaming data may have to be temporarily stored elsewhere until the processor 50 can process the data.

The streaming data, however, may be voluminous in addition to having high data rates. Moreover, the data may not be available during a subsequent read cycle. Thus, the data may be lost if not captured when the data is available. Due to the volume and rate at which the data is received, a large amount of high-speed memory may be necessary to store the data to prevent data loss due to memory overflow. Adding large amount of high-speed memory, however, may increase hardware costs.

Loss of streaming data due to memory overflow may be avoided by using the CPU memory 52 to store the data when the data memory 54 is full and when the processor core 50-1 is not using the CPU memory. This scheme, however, cannot guarantee that the CPU memory 52 will always be available to store the data. Consequently, the data can be lost.

Figure 3:
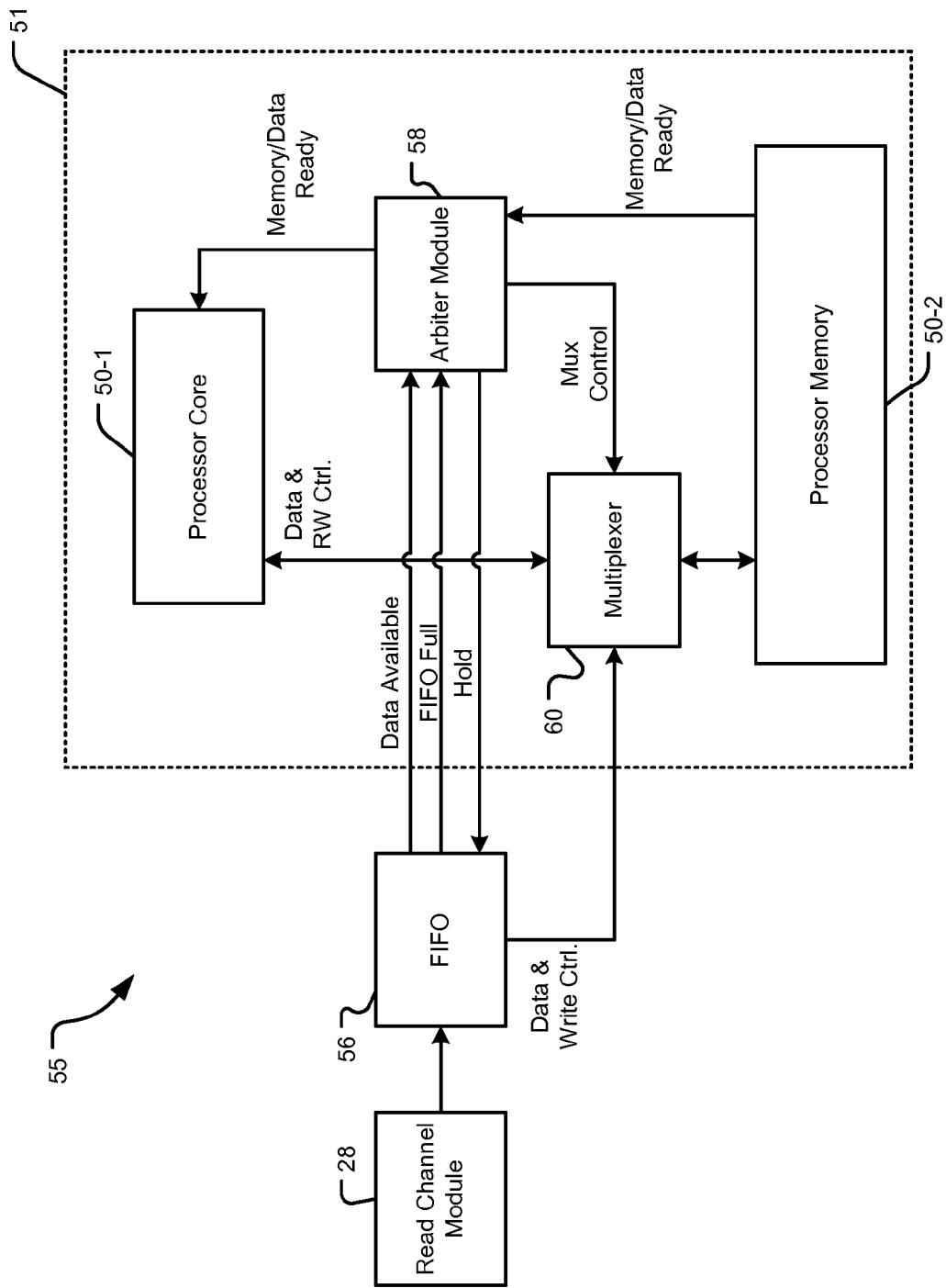
FIG. 3 is a functional block diagram of an exemplary system for receiving, storing, and processing streaming data according to the present disclosure.

Referring now to FIG. 3, a system 55 for receiving, storing, and processing streaming data in a hard disk may comprise a read-channel module 28, a first-in first-out (FIFO) module 56, and a processor 51. The processor 51 may include a processor core 50-1, processor memory 50-2, an arbiter module 58, and a multiplexer 60.

When the read-channel module 28 fails to correct errors in data, the FIFO module 56 may receive streaming data from the read-channel module 28. The FIFO module 56 may transfer the data to the processor memory 50-2 using direct memory access (DMA) to the processor memory 50-2. The processor core 50-1 may read the data from the processor memory 50-2 and may perform error-correction using data-recovery algorithms in addition to performing other functions.

The processor core 50-1 may reserve a portion of the processor memory 50-2 to perform other functions such as servo calculations, etc. Additionally, the processor core 50-1 may allocate an address space in the remaining processor memory 50-2 to the FIFO module 56 for transferring the streaming data.

The arbiter module 58 controls the access to the processor memory 50-2 by the FIFO module 56 and the processor core 50-1 based on priority settings assigned by the processor core 50-1. The arbiter module 58 adjusts the priority settings of the FIFO module 56 and the processor core 50-1 based on states of a FIFO full signal generated by the FIFO module 56.

The priority settings may grant the FIFO module 56 sufficient access to the processor memory 50-2 so that the FIFO module 56 may not overflow. Additionally, the priority settings may grant the processor core 50-1 sufficient access to the processor memory 50-2 so that the processor core 50-1 can perform data-recovery and other functions.

The processor core 50-1 may determine a memory threshold at which the FIFO module 56 may generate the FIFO full signal having a first state. The first state of the FIFO full signal may indicate that the FIFO module 56 is P % full or that the memory available in the FIFO module 56 is less than the memory threshold (1−P %), where $1 \leq P \leq 100$. For example, the FIFO module 56 may generate the FIFO full signal having the first state when less than 10% of the memory in the FIFO module 56 is available to store the data received from the read-channel module 28 (i.e., when the FIFO module 56 is more than 90% full).

When the FIFO full signal is in the first state, the arbiter module 58 sets the priority of the FIFO module 56 higher than the priority of the processor core 50-1 to access the processor memory 50-2. The FIFO module 56 transfers data to the processor memory 50-2 until the memory available in the FIFO module 56 is greater than the memory threshold. Alternatively, the FIFO module 56 may transfer data to the processor memory 50-2 until the memory available in the FIFO module 56 is greater than another memory threshold that is different than the memory threshold. Skilled artisans can appreciate that the processor core 50-1 may dynamically change memory thresholds based on the frequency at which the FIFO module 56 becomes full and/or the frequency at which the processor core 50-1 accesses the processor memory 50-2.

Subsequently, the FIFO module 56 changes the state of the FIFO full signal from the first state to a second state. The arbiter module 58 restores the priority setting of the FIFO module 56. Thus, the FIFO module 56 does not overflow, and data is not lost.

When the FIFO full signal is in the second state, the FIFO module 56 may access the processor memory 50-2 whenever the processor core 50-1 is not accessing the processor memory 50-2. The processor core 50-1 may access the processor memory 50-2 when the processor core 50-1 performs other functions or processes data transferred by the FIFO module 56 into the processor memory 50-2. The arbiter module 58 may generate a memory/data ready signal having a first state to indicate to the processor core 50-1 that the processor memory 50-2 is available or has data to process.

When the FIFO full signal is in the second state, the processor core 50-1 may access the processor memory 50-2 at any time. The arbiter module 58 may generate a multiplexer control signal having a first state. When the multiplexer control signal is in the first state, the multiplexer 60 grants the processor core 50-1 access to the processor memory 50-2. Additionally, the arbiter module 58 may generate a hold signal that indicates to the FIFO module 56 that the FIFO module 56 may not access the processor memory 50-2.

The processor core 50-1 may process the data stored in the processor memory 50-2 and attempt to correct errors in the data using the data-recovery algorithms. While the processor core 50-1 accesses the processor memory 50-2, the FIFO module 56 stores the streaming data received from the read-channel module 28 in the FIFO module 56.

On the other hand, the FIFO module 56 may request access to the processor memory 50-2 in two ways: by generating a data available signal and by generating the FIFO full signal having the first state. When the FIFO module 56 requests access to the processor memory 50-2 by generating the data available signal and when the FIFO full signal is in the second state, the arbiter module 58 determines whether the processor core 50-1 is accessing the processor memory 50-2. If the processor core 50-1 is accessing the processor memory 50-2 and if the FIFO full signal is in the second state, the arbiter module 58 may generate the hold signal so that the FIFO module 56 cannot access the processor memory 50-2.

If, however, the processor core 50-1 is not accessing the processor memory 50-2, the arbiter module 58 does not generate the hold signal. Additionally, the arbiter module 58 changes the state of the multiplexer control signal from the first state to a second state. When the multiplexer control signal is in the second state, the multiplexer 60 grants the FIFO module 56 access to the processor memory 50-2. The FIFO module 56 transfers data to the processor memory 50-2 until the processor core 50-1 accesses the processor memory 50-2.

Alternatively, when the FIFO module 56 requests access to the processor memory 50-2 by generating the FIFO full signal having the first state, the arbiter module 58 increases the priority of the FIFO module 56 to access the processor memory 50-2. Additionally or alternatively, the arbiter module 58 may decrease the priority of the processor core 50-1 at which the processor core 50-1 can access the processor memory 50-2.

Specifically, when the arbiter module 58 receives the FIFO full signal having the first state, the arbiter module 58 changes the state of the memory/data ready signal from the first state to a second state. The memory/data ready signal having the second state indicates to the processor core 50-1 that the processor memory 50-2 is unavailable.

Additionally, the arbiter module 58 changes the state of the multiplexer control signal from the first state to the second state. The multiplexer 60 grants the FIFO module 56 access to the processor memory 50-2. The FIFO module 56 may transfer the data to the processor memory 50-2 at the increased priority until the amount of memory available in the FIFO module 56 increases and is greater than the memory threshold. In the meantime, the processor core 50-1 cannot access the processor memory 50-2. Thus, the FIFO module 56 may not become 100% full, and the data being received by the FIFO module 56 may not be lost due to memory overflow in the FIFO module 56.

When the memory available in the FIFO module 56 is greater than the memory threshold (or another memory threshold set by the processor core 50-1), the FIFO module 56 may change the state of the FIFO full signal from the first state to the second state. When the arbiter module 58 detects that the FIFO full signal has changed state from the first state to the second state, the arbiter module 58 may decrease or restore the priority of the FIFO module 56 to access the processor memory 50-2.

Additionally or alternatively, the arbiter module 58 may increase or restore the priority of the processor core 50-1 to access the processor memory 50-2. The arbiter module 58 may change the state of the memory/data ready signal from the second state to the first state. The processor core 50-1 may access the processor memory 50-2 and process the data stored in the processor memory 50-2 or perform other functions at the restored priority.

The arbiter module 58 sets the state of the data/memory ready signal to the second state only when the FIFO full signal is in the first state, i.e., when the FIFO module 56 may overflow. Thus, the arbiter module 58 ensures that the FIFO module 56 may not use the processor memory 50-2 at the increased priority unless the FIFO module 56 is likely to overflow.

Thus, by monitoring the FIFO full signal generated by the FIFO module 56, the arbiter module 58 may adjust priorities of the FIFO module 56 and the processor core 50-1 at which the FIFO module 56 and the processor core 50-1 can access the processor memory 50-2. Consequently, the streaming data received from the read-channel 28 may not be lost due to memory overflow in the FIFO module 56. Additionally, the processor core 50-1 can process the streaming data using data-recovery algorithms and perform other functions using the processor memory 50-2.

Figure 4:
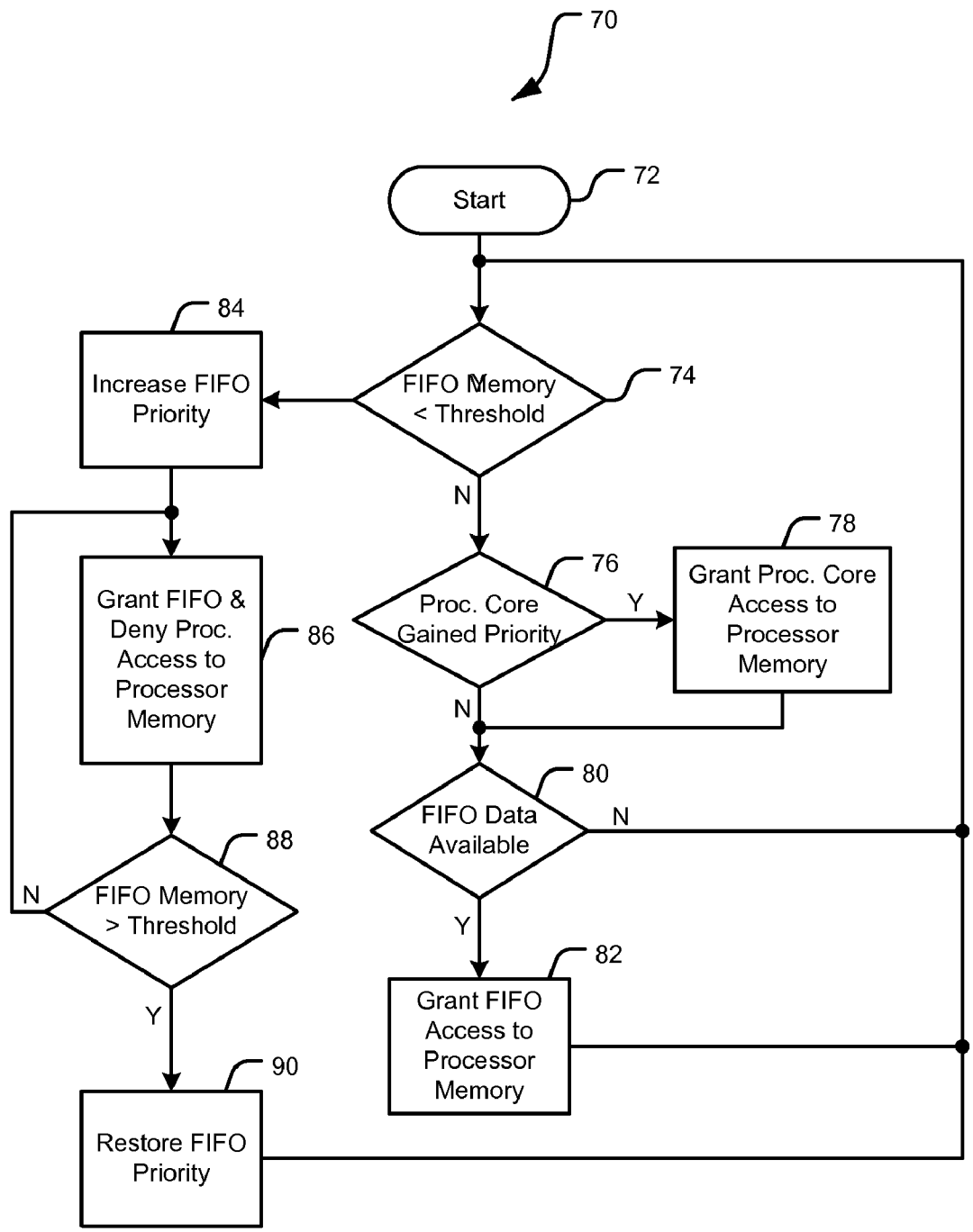
FIG. 4 is a flowchart of an exemplary method for receiving, storing, and processing streaming data according to the present disclosure.

Referring now to FIG. 4, a method 70 for receiving, storing, and processing streaming data begins at step 72. In step 74, the arbiter module 58 determines based on the state of the FIFO full signal whether memory available in the FIFO module 56 is less than the predetermined threshold. If false, the arbiter module 58 determines in step 76 whether the FIFO module 56 has data available. Specifically, in step 76, the arbiter module 58 monitors the data available signal generated by the FIFO module 56 and determines whether the FIFO module 56 requests access to the processor memory 50-2. If the result of step 76 is false, the arbiter module 58 grants the processor core 50-1 access to the processor memory 50-2 in step 78. Specifically, in step 78, the arbiter module 58 generates the multiplexer control signal having the first state, and the multiplexer 60 grants the processor core 50-1 access to the processor memory 50-2. Subsequently, the method 70 returns to step 74.

If, however, the result of step 76 is true, the arbiter module 58 determines in step 80 whether the processor core 50-1 is accessing the processor memory 50-2. If true, the method 70 returns to step 74. If false, however, the arbiter module 58 changes the state of the multiplexer control signal from first to second state, and the multiplexer 60 grants the FIFO module 56 access to the processor memory 50-2 in step 82. Subsequently, the method 70 returns to step 74.

If the result of step 74 is true, in step 84, the arbiter module 58 increases the priority of the FIFO module 56 to access the processor memory 50-2. In step 86, the arbiter module 58 generates the multiplexer control signal having the second state, and the multiplexer 60 grants the FIFO module 56 and denies the processor core 50-1 access to the processor memory 50-2.

The arbiter module 58 determines in step 88 whether the FIFO module 56 is still full. Specifically, in step 88, the arbiter module 58 determines if the memory available in the FIFO module 56 is still less than the predetermined threshold (or another threshold) by checking whether the FIFO full signal is still in the first state. If true, step 86 is repeated. If false, the arbiter module 58 restores the priority of the FIFO module 56 to access the processor memory 50-2 in step 90. Subsequently, the method 70 returns to step 74.

Although the present disclosure teaches receiving, storing, and processing streaming data using internal memory of processors implemented by SOC, the teachings of the disclosure may be applicable to systems that are not implemented by SOC. That is, the scope of the disclosure is not limited to using internal memory of processors when the processors are implemented by SOC.

Additionally, the teachings may be utilized in any device or system that receives, stores, and processes streaming data. For example, a satellite receiver that receives streaming data may utilize the teachings to receive, store, and process streaming data using internal memory of a processor in the receiver instead of using additional memory external to the processor. Thus, the teachings may be utilized in signal processors, electronic testers, etc. that receive, store, and process large amounts of signals/data at high sample rates.

Figure 5A:
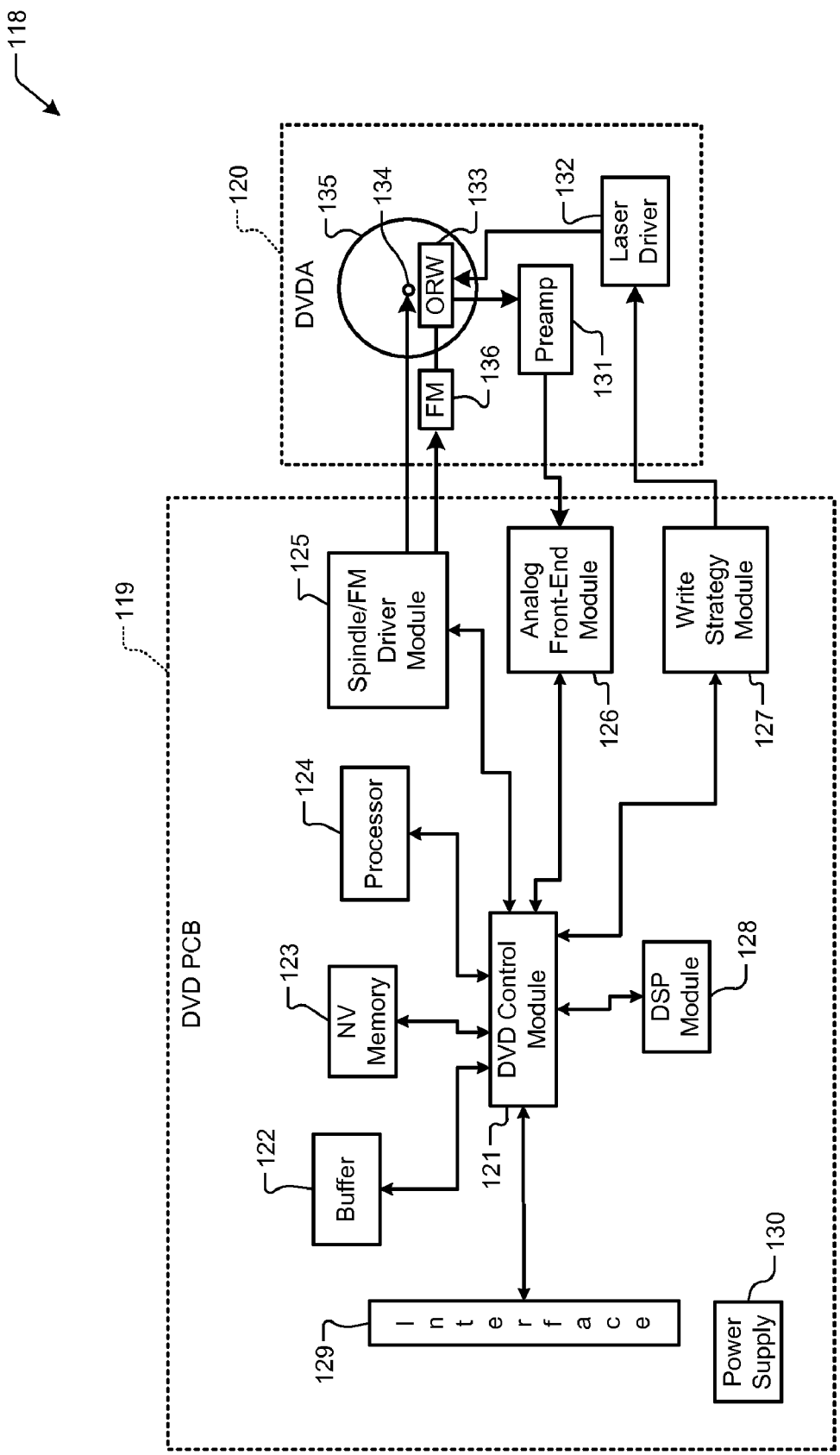
FIG. 5A is a functional block diagram of a digital versatile disk (DVD)

Referring now to FIGS. 5A-5F, various exemplary implementations incorporating the teachings of the present disclosure are shown. Referring now to FIG. 5A, the teachings of the disclosure can be implemented in at least one of a digital signal processing (DSP) module 128 and a DVD control module 121 of a DVD drive 118 or of a CD drive (not shown). The DVD drive 118 includes a DVD PCB 119 and a DVD assembly (DVDA) 120. The DVD PCB 119 includes the DVD control module 121, a buffer 122, nonvolatile memory 123, a processor 124, a spindle/FM (feed motor) driver module 125, an analog front-end module 126, a write strategy module 127, and the DSP module 128.

The DVD control module 121 controls components of the DVDA 120 and communicates with an external device (not shown) via an I/O interface 129. The external device may include a computer, a multimedia device, a mobile computing device, etc. The I/O interface 129 may include wireline and/or wireless communication links.

The DVD control module 121 may receive data from the buffer 122, nonvolatile memory 123, the processor 124, the spindle/FM driver module 125, the analog front-end module 126, the write strategy module 127, the DSP module 128, and/or the I/O interface 129. The processor 124 may process the data, including encoding, decoding, filtering, and/or formatting. The DSP module 128 performs signal processing, such as video and/or audio coding/decoding. The processed data may be output to the buffer 122, nonvolatile memory 123, the processor 124, the spindle/FM driver module 125, the analog front-end module 126, the write strategy module 127, the DSP module 128, and/or the I/O interface 129.

The DVD control module 121 may use the buffer 122 and/or nonvolatile memory 123 to store data related to the control and operation of the DVD drive 118. The buffer 122 may include DRAM, SDRAM, etc. The nonvolatile memory 123 may include flash memory (including NAND and NOR flash memory), phase change memory, magnetic RAM, or multi-state memory, in which each memory cell has more than two states. The DVD PCB 119 includes a power supply 130 that provides power to the components of the DVD drive 118.

The DVDA 120 may include a preamplifier device 131, a laser driver 132, and an optical device 133, which may be an optical read/write (ORW) device or an optical read-only (OR) device. A spindle motor 134 rotates an optical storage medium 135, and a feed motor 136 actuates the optical device 133 relative to the optical storage medium 135.

When reading data from the optical storage medium 135, the laser driver provides a read power to the optical device 133. The optical device 133 detects data from the optical storage medium 135, and transmits the data to the preamplifier device 131. The analog front-end module 126 receives data from the preamplifier device 131 and performs such functions as filtering and A/D conversion. To write to the optical storage medium 135, the write strategy module 127 transmits power level and timing information to the laser driver 132. The laser driver 132 controls the optical device 133 to write data to the optical storage medium 135.

Figure 5C:
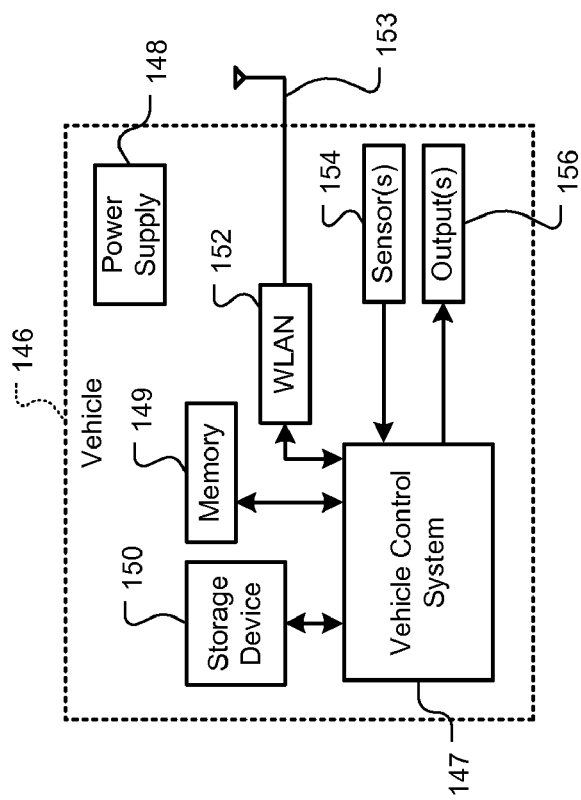
FIG. 5C is a functional block diagram of a vehicle control system.
Figure 5B:
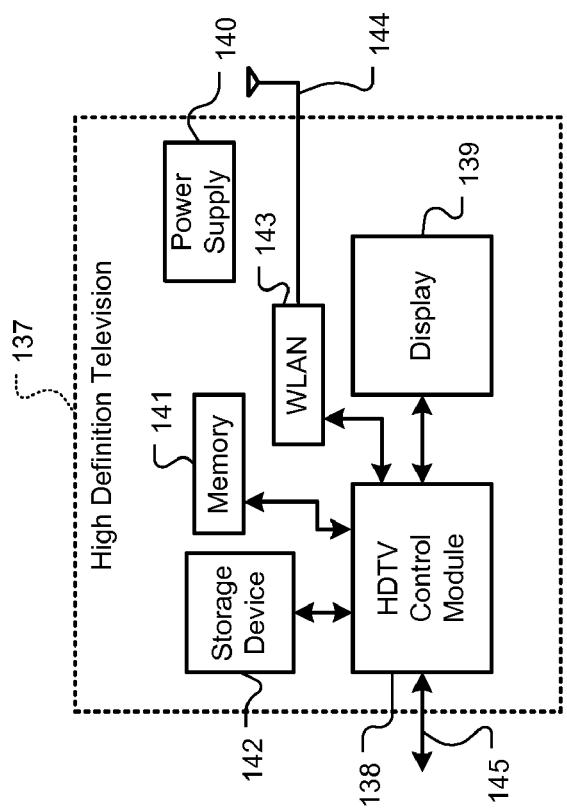
FIG. 5B is a functional block diagram of a high definition television.

Referring now to FIG. 5B, the teachings of the disclosure can be implemented in a high-definition television (HDTV) control module 138 of a HDTV 137. The HDTV 137 includes the HDTV control module 138, a display 139, a power supply 140, memory 141, a storage device 142, a WLAN interface 143 and associated antenna 144, and an external interface 145.

The HDTV 137 can receive input signals from the WLAN interface 143 and/or the external interface 145, which sends and receives information via cable, broadband Internet, and/or satellite. The HDTV control module 138 may process the input signals, including encoding, decoding, filtering, and/or formatting, and generate output signals. The output signals may be communicated to one or more of the display 139, memory 141, the storage device 142, the WLAN interface 143, and the external interface 145.

Memory 141 may include random access memory (RAM) and/or nonvolatile memory such as flash memory, phase change memory, or multi-state memory, in which each memory cell has more than two states. The storage device 142 may include an optical storage drive, such as a DVD drive, and/or a hard disk drive (HDD). The HDTV control module 138 communicates externally via the WLAN interface 143 and/or the external interface 145. The power supply 140 provides power to the components of the HDTV 137.

Referring now to FIG. 5C, the teachings of the disclosure may be implemented in a vehicle control system 147 of a vehicle 146. The vehicle 146 may include the vehicle control system 147, a power supply 148, memory 149, a storage device 150, and a WLAN interface 152 and associated antenna 153. The vehicle control system 147 may be a powertrain control system, a body control system, an entertainment control system, an anti-lock braking system (ABS), a navigation system, a telematics system, a lane departure system, an adaptive cruise control system, etc.

The vehicle control system 147 may communicate with one or more sensors 154 and generate one or more output signals 156. The sensors 154 may include temperature sensors, acceleration sensors, pressure sensors, rotational sensors, airflow sensors, etc. The output signals 156 may control engine operating parameters, transmission operating parameters, suspension parameters, etc.

The power supply 148 provides power to the components of the vehicle 146. The vehicle control system 147 may store data in memory 149 and/or the storage device 150. Memory 149 may include random access memory (RAM) and/or nonvolatile memory such as flash memory, phase change memory, or multi-state memory, in which each memory cell has more than two states. The storage device 150 may include an optical storage drive, such as a DVD drive, and/or a hard disk drive (HDD). The vehicle control system 147 may communicate externally using the WLAN interface 152.

Figure 5E:
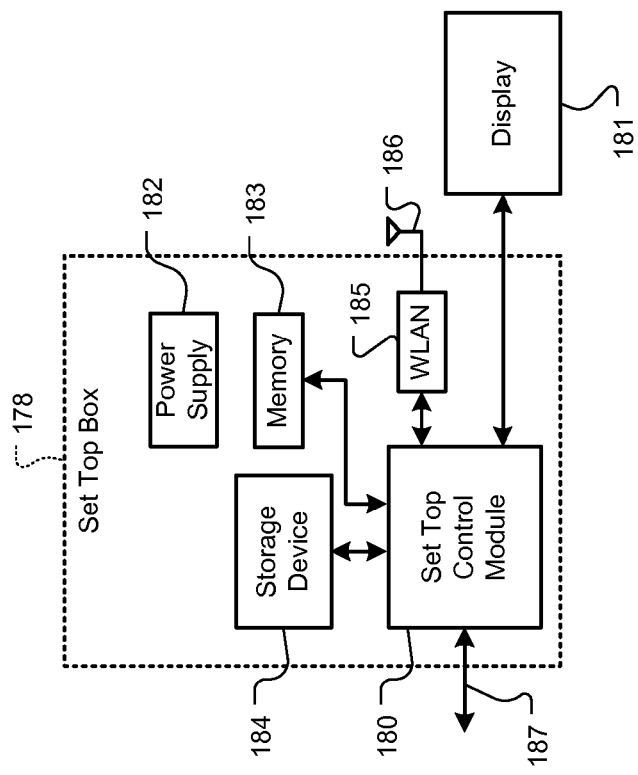
FIG. 5E is a functional block diagram of a set top box.
Figure 5D:
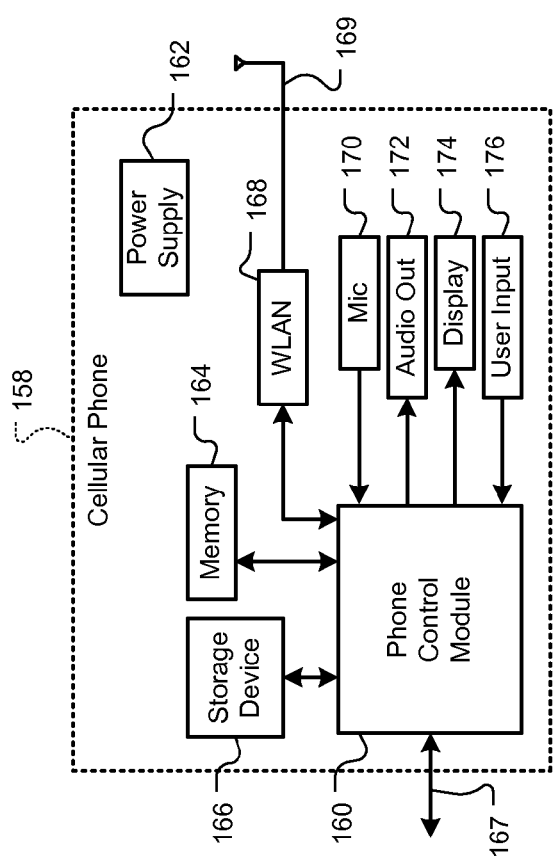
FIG. 5D is a functional block diagram of a cellular phone.

Referring now to FIG. 5D, the teachings of the disclosure can be implemented in a phone control module 160 of a cellular phone 158. The cellular phone 158 includes the phone control module 160, a power supply 162, memory 164, a storage device 166, and a cellular network interface 167. The cellular phone 158 may include a WLAN interface 168 and associated antenna 169, a microphone 170, an audio output 172 such as a speaker and/or output jack, a display 174, and a user input device 176 such as a keypad and/or pointing device.

The phone control module 160 may receive input signals from the cellular network interface 167, the WLAN interface 168, the microphone 170, and/or the user input device 176. The phone control module 160 may process signals, including encoding, decoding, filtering, and/or formatting, and generate output signals. The output signals may be communicated to one or more of memory 164, the storage device 166, the cellular network interface 167, the WLAN interface 168, and the audio output 172.

Memory 164 may include random access memory (RAM) and/or nonvolatile memory such as flash memory, phase change memory, or multi-state memory, in which each memory cell has more than two states. The storage device 166 may include an optical storage drive, such as a DVD drive, and/or a hard disk drive (HDD). The power supply 162 provides power to the components of the cellular phone 158.

Referring now to FIG. 5E, the teachings of the disclosure can be implemented in a set top control module 180 of a set top box 178. The set top box 178 includes the set top control module 180, a display 181, a power supply 182, memory 183, a storage device 184, and a WLAN interface 185 and associated antenna 186.

The set top control module 180 may receive input signals from the WLAN interface 185 and an external interface 187, which can send and receive information via cable, broadband Internet, and/or satellite. The set top control module 180 may process signals, including encoding, decoding, filtering, and/or formatting, and generate output signals. The output signals may include audio and/or video signals in standard and/or high definition formats. The output signals may be communicated to the WLAN interface 185 and/or to the display 181. The display 181 may include a television, a projector, and/or a monitor.

The power supply 182 provides power to the components of the set top box 178. Memory 183 may include random access memory (RAM) and/or nonvolatile memory such as flash memory, phase change memory, or multi-state memory, in which each memory cell has more than two states. The storage device 184 may include an optical storage drive, such as a DVD drive, and/or a hard disk drive (HDD).

Figure 5F:
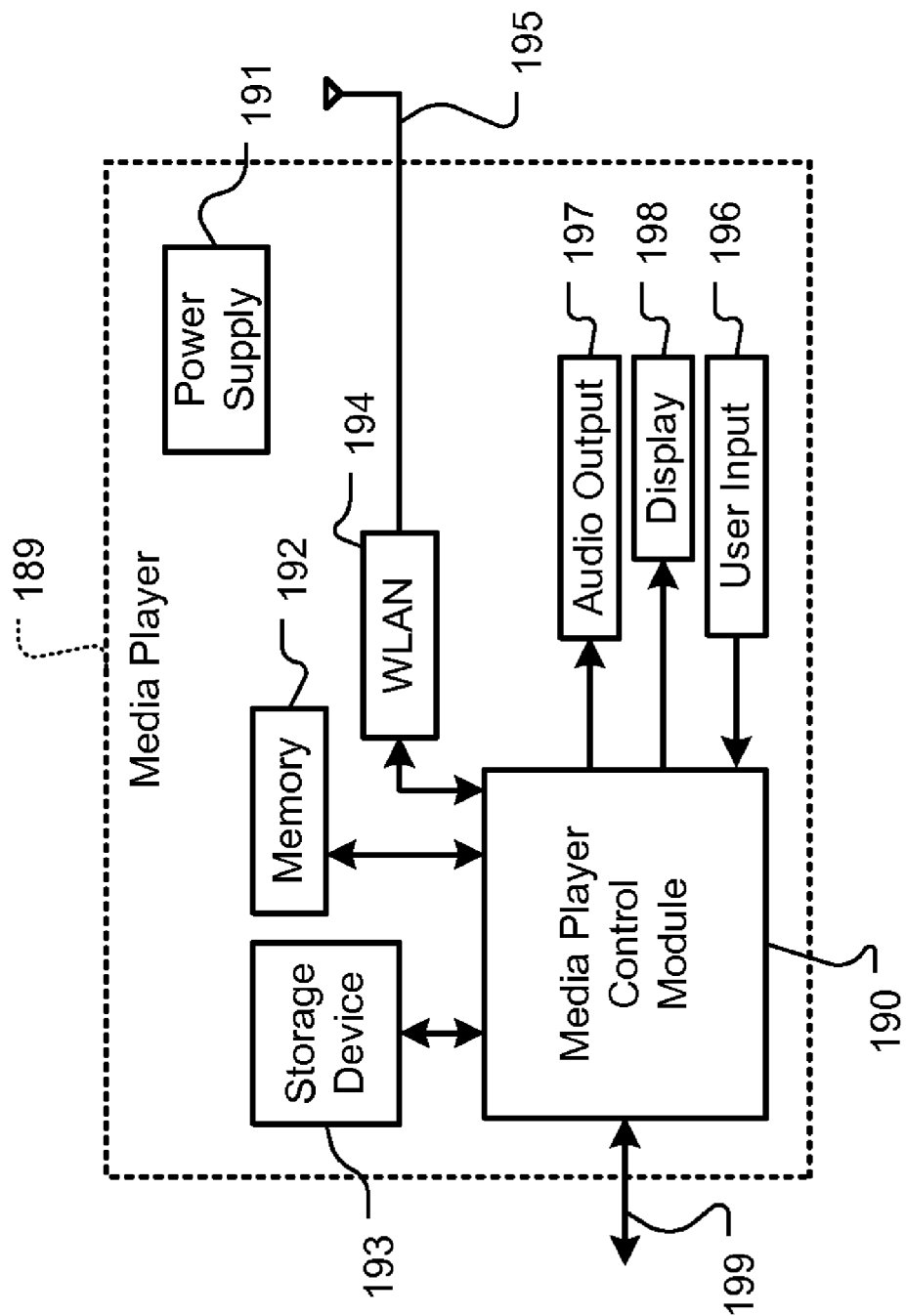
FIG. 5F is a functional block diagram of a media player.

Referring now to FIG. 5F, the teachings of the disclosure can be implemented in a media player control module 190 of a media player 189. The media player 189 may include the media player control module 190, a power supply 191, memory 192, a storage device 193, a WLAN interface 194 and associated antenna 195, and an external interface 199.

The media player control module 190 may receive input signals from the WLAN interface 194 and/or the external interface 199. The external interface 199 may include USB, infrared, and/or Ethernet. The input signals may include compressed audio and/or video, and may be compliant with the MP3 format. Additionally, the media player control module 190 may receive input from a user input 196 such as a keypad, touchpad, or individual buttons. The media player control module 190 may process input signals, including encoding, decoding, filtering, and/or formatting, and generate output signals.

The media player control module 190 may output audio signals to an audio output 197 and video signals to a display 198. The audio output 197 may include a speaker and/or an output jack. The display 198 may present a graphical user interface, which may include menus, icons, etc. The power supply 191 provides power to the components of the media player 189. Memory 192 may include random access memory (RAM) and/or nonvolatile memory such as flash memory, phase change memory, or multi-state memory, in which each memory cell has more than two states. The storage device 193 may include an optical storage drive, such as a DVD drive, and/or a hard disk drive (HDD).

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

The invention claimed is:

1. A system, comprising:
a processor including i) a processor core and ii) a memory;
a first-in first-out (FIFO) module configured to
   receive streaming data,
   output the streaming data to the memory of the processor, and
   selectively generate a control signal; and
an arbiter module configured to adjust, based on the control signal, a priority in which at least one of the processor core and the FIFO module accesses the memory of the processor.

2. The system of claim 1, wherein the FIFO module is configured to output the streaming data via direct memory access (DMA) to the memory of the processor.

3. The system of claim 1, wherein the FIFO module is configured to generate the control signal in response to an amount of memory available in the FIFO module to store the streaming data decreasing to less than a first predetermined threshold.

4. The system of claim 3, wherein the arbiter module is configured to increase the priority in which the FIFO module accesses the memory of the processor in response to the amount of memory available in the FIFO module to store the streaming data decreasing to less than the first predetermined threshold.

5. The system of claim 4, wherein the FIFO module is configured to output the streaming data to the memory of the processor at an increased priority as determined by the arbiter module until a time that the memory available in the FIFO module to store the streaming data increases to greater than a second predetermined threshold.

6. The system of claim 3, wherein the arbiter module is configured to decrease the priority in which the processor core accesses the memory of the processor in response to the amount of memory available in the FIFO module to store the streaming data decreasing to less than the first predetermined threshold.

7. The system of claim 6, wherein the processor core is configured to access the memory of the processor at a decreased priority as determined by the arbiter module until a time that the memory available in the FIFO module to store the streaming data increases to greater than a second predetermined threshold.

8. The system of claim 1, wherein the FIFO module is configured to generate the control signal in response to an amount of memory available in the FIFO module to store the streaming data increasing to greater than a first predetermined threshold.

9. The system of claim 8, wherein the arbiter module is configured to decrease the priority in which the FIFO module accesses the memory of the processor in response to the amount of memory available in the FIFO module to store the streaming data increasing to greater than the first predetermined threshold.

10. The system of claim 9, wherein the FIFO module is configured to output the streaming data to the memory of the processor at a decreased priority as determined by the arbiter module until a time that the memory available in the FIFO module to store the streaming data decreases to less than a second predetermined threshold.

11. The system of claim 8, wherein the arbiter module is configured to increase the priority in which the processor core accesses the memory of the processor in response to the memory available in the FIFO module to store the streaming data increasing to greater than the first predetermined threshold.

12. The system of claim 11, wherein the processor core is configured to access the memory of the processor at an increased priority as determined by the arbiter module until a time that the memory available in the FIFO module to store the streaming data decreases to less than a second predetermined threshold.

13. A disk drive system-on-chip (SOC) comprising:
the system of claim 1; and
a read-channel module configured to output the streaming data to the FIFO module.

14. A method, comprising:
receiving streaming data in a first-in first-out (FIFO) module;
outputting the streaming data from the FIFO module to a memory of a processor;
selectively generating a control signal; and
adjusting, based on the control signal, a priority in which of at least one of i) a processor core of the processor and ii) the FIFO module accesses the memory of the processor.

15. The method of claim 14, wherein outputting the streaming data from the FIFO module to the memory of the processor comprises:
outputting the streaming data from the FIFO module via direct memory access (DMA) to the memory of the processor.

16. The method of claim 14, wherein selectively generating the control signal comprises generating the control signal in response to an amount of memory available in the FIFO module to store the streaming data decreasing to less than a first predetermined threshold.

17. The method of claim 16, wherein adjusting, based on the control signal, the priority in which of at least one of i) the processor core of the processor and ii) the FIFO module accesses the memory of the processor comprises:
increasing the priority in which the FIFO module accesses the memory of the processor in response to the amount of memory available in the FIFO module to store the streaming data decreasing to less than the first predetermined threshold.

18. The method of claim 17, further comprising outputting the streaming data to the memory of the processor at an increased priority until a time that the memory available in the FIFO module to store the streaming data increases to greater than a second predetermined threshold.

19. The method of claim 16, wherein adjusting, based on the control signal, the priority in which of at least one of i) the processor core of the processor and ii) the FIFO module accesses the memory of the processor comprises:
decreasing the priority in which the processor core accesses the memory of the processor in response to the amount of memory available in the FIFO module to store the streaming data decreasing to less than the first predetermined threshold.

20. The method of claim 19, wherein decreasing the priority in which the processor core accesses the memory of the processor comprises:
decreasing the priority of the processor core to access the memory of the processor until a time that the memory available in the FIFO module to store the streaming data increases to greater than a second predetermined threshold.

21. The method of claim 14, wherein selectively generating the control signal comprises generating the control signal in response to an amount of memory available in the FIFO module to store the streaming data increasing to greater than a first predetermined threshold.

22. The method of claim 21, wherein adjusting, based on the control signal, the priority in which of at least one of i) the processor core of the processor and ii) the FIFO module accesses the memory of the processor comprises:
decreasing the priority in which the FIFO module accesses the memory of the processor in response to the amount of memory available in the FIFO module to store the streaming data increasing to greater than the first predetermined threshold.

23. The method of claim 22, further comprising outputting the streaming data to the memory of the processor at a decreased priority until a time that the memory available in the FIFO module to store the streaming data decreases to less than a second predetermined threshold.

24. The method of claim 21, wherein adjusting, based on the control signal, the priority in which of at least one of i) the processor core of the processor and ii) the FIFO module accesses the memory of the processor comprises:
increasing the priority in which the processor core accesses the memory of the processor in response to the amount of memory available in the FIFO module to store the streaming data increasing to greater than the first predetermined threshold.

25. The method of claim 24, wherein increasing the priority in which the processor core accesses the memory of the processor comprises:
increasing the priority in which the processor core accesses the memory of the processor until a time that the memory available in the FIFO module to store the streaming data decreases to less than a second predetermined threshold.

\* \* \* \* \*